United States Patent
Nagase et al.

(10) Patent No.: US 6,344,661 B1
(45) Date of Patent: Feb. 5, 2002

(54) LIGHT EMITTING ELEMENT ARRAY, EXPOSURE DEVICE AND IMAGE FORMING APPARATUS

(75) Inventors: Yukio Nagase; Noboru Koumura; Izumi Narita, all of Shizuoka-ken; Seiji Mashimo, Yokohama, all of (JP)

(73) Assignee: Canon Kabushiki Kaisha

( * ) Notice: Subject to any disclaimer, the term of this patent is extended or adjusted under 35 U.S.C. 154(b) by 0 days.

(21) Appl. No.: 09/420,390

(22) Filed: Oct. 19, 1999

(30) Foreign Application Priority Data

Oct. 22, 1998 (JP) .......................................... 10-300502

(51) Int. Cl.[7] .............................................. H01L 35/24
(52) U.S. Cl. .......................... 257/40; 257/918; 438/22; 438/82; 438/99
(58) Field of Search .................. 257/49, 911; 438/129, 438/131; 219/543, 552, 553

(56) References Cited

U.S. PATENT DOCUMENTS 5,475,417 A  12/1995  Ogata et al. ................. 347/244
5,482,896 A   1/1996  Tang ........................... 437/209
6,111,357 A * 8/2000  Fleming et al. ............. 313/509
6,266,074 B1 * 7/2001  Koumura et al. ........... 347/133

FOREIGN PATENT DOCUMENTS

| EP | 0 571 737 | 12/1993 | |
| EP | 0 704 915 | 4/1996 | |
| JP | 60-198873 | 10/1985 | |
| JP | 03-90370 | * 4/1989 | .............. B41J/2/45 |

* cited by examiner

*Primary Examiner*—Olik Chaudhuri
*Assistant Examiner*—Wai-Sing Louie
(74) *Attorney, Agent, or Firm*—Fitzpatrick, Cella, Harper & Scinto

(57) ABSTRACT

An exposure device having an array of a plurality of light emitting elements composed of at least an anode layer, a cathode layer and one or more organic compound layers interposed between the anode layer and the cathode layer all of which are formed on a substrate. In the exposure device, the quantity of light emitted from each light emitting element is made uniform by controlling the light emitting area of each light emitting element. Therefore, the exposure device eliminates differences in the quantity of emitted light among the plurality of light emitting elements without using a special drive circuit.

10 Claims, 5 Drawing Sheets

LIGHT EMITTING ELEMENT ARRAY, EXPOSURE DEVICE AND IMAGE FORMING APPARATUS

BACKGROUND OF THE INVENTION

1. Field of the Invention

The present invention relates to a light emitting element array, an exposure device for exposing a photosensitive member using the light emitting element array and an image forming apparatus for forming an image through the exposure of the photosensitive member. In this type of image forming apparatus, an image is formed on a photosensitive member by exposing the photosensitive member in electrophotography manner to a light from an array of a plurality of light emitting elements.

2. Related Background Art

The formation of an image by electrophotography is a process consisting of a series of the following steps as is already known: forming a latent image by forming an optical image on a photosensitive member with a light emitting device, developing the latent image with a toner, transferring the image to a transfer material (paper), fixing it and finally cleaning the photosensitive member.

In an image forming apparatus, laser optical systems, in which a laser beam scanning is performed through a polygon mirror, are widely used as an exposure unit for forming a latent image on the surface of a photosensitive member because they have high resolution and high speed. However, since a large space is required to arrange optical parts such as a polygon mirror and lenses, it is difficult to reduce the size of this device. Further, since the scanning of the laser beam is carried out by the mechanical rotation movement of the polygon mirror, there is a limitation in increasing the operation speed.

To cope with this, much attention is paid to an array of a plurality of organic light emitting elements which does not involve the above problems as a light emitting device. Mechanical scanning is not required for the light emitting element array, scanning with an electrical signal is carried out, and such optical system as a polygon mirror and lenses are not necessary, thereby eliminating the above problems of the arrangement space of the laser optical system and limitation to the operation speed. As for concrete constitution, a plurality of light emitting elements are composed of a transparent anode layer, organic compound layer and cathode layer which are formed on a prolonged belt-like transparent substrate in the order named and arranged linearly. The organic compound layer is formed like a prolonged belt which is common to a plurality of light emitting elements and its front and rear sides are supported by a combination of predetermined cathode and anode patterns and emit light independently.

When the entire light emitting element array is formed on a single substrate, it becomes expensive. Therefore, a plurality of light emitting element chips are synthesized and disposed in an array. However, since there are differences in light emission characteristics among the plurality of chips, there is nonuniformity in the quantity of emitted light among the plurality of chips.

To solve this problem, after a light emitting element array is formed, the emitted light quantity distribution of all the elements is measured to prepare light quantity compensation data for each of the light emitting elements so as to correct the quantity of light individually with the light quantity correction circuit (for example, current correction or pulse width correction) of a drive circuit based on the data. However, there is such a problem that the drive circuit or the like becomes complex in structure.

Alternatively, it is conceivable that a drive circuit is provided in each light emitting element and a thin film resistor substrate in the drive circuit is corrected by laser trimming or the like to optimize a light emission current. However, this method cannot be adapted to a time division drive system for sharing a drive circuit to reduce costs, and hence is not generally employed.

SUMMARY OF THE INVENTION

It is an object of the present invention to attain uniformity in the quantity of light emitted from the above array of light emitting elements with a simple structure.

According to the present invention, the area of each light emitting portion is adjusted in accordance with the quantity of light emitted from each of a plurality of light emitting elements in a light emitting element array. That is, the area of the light emitting portion of a light emitting element which emits a large quantity of light is made relatively small whereas the area of the light emitting portion of a light emitting element which emits a small quantity of emitted light is made relatively large, thereby making uniform the light quantity distribution of the entire array of light emitting elements.

According to an embodiment of the present invention, the area of the light emitting portion of a light emitting element which emits a relatively large quantity of light out of a plurality of light emitting elements is selectively reduced. A reduction in the area of the light emitting portion is attained by irradiating part of the light emitting portion with an energy beam to modify the electrode or light emitting layer of the portion to prevent it from emitting light.

DESCRIPTION OF THE PREFERRED EMBODIMENTS

The present invention will be described in detail hereinunder with reference to the accompanying drawings.

Figure 1:
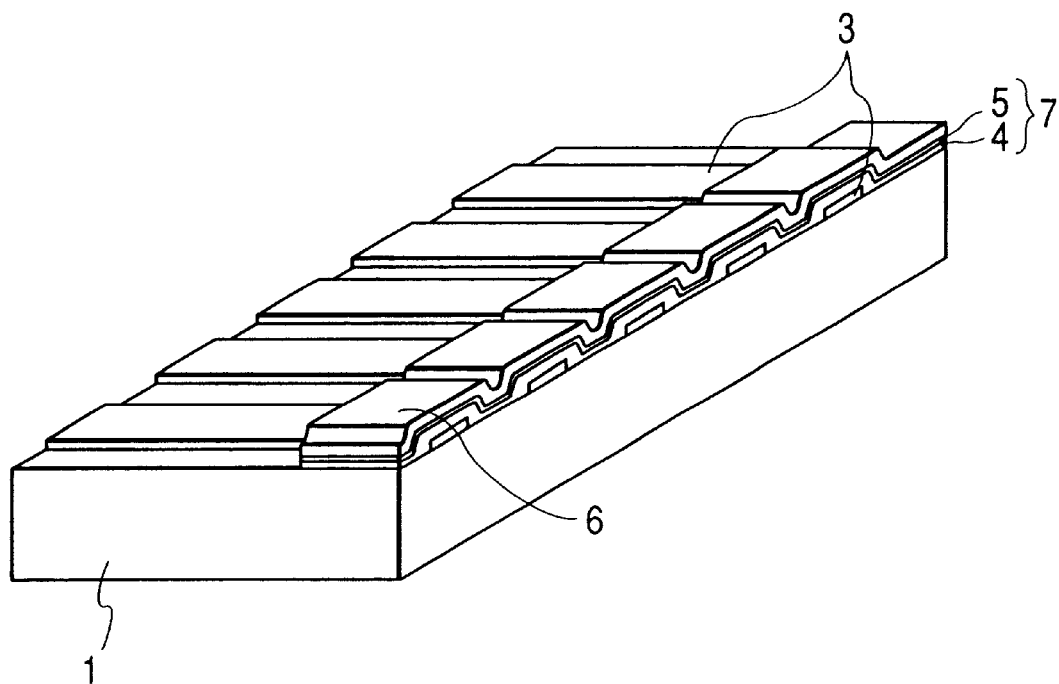
FIG. 1 is a perspective view showing an example of the exposure device of the present invention.

FIG. 1 is a perspective view showing an example of a light emitting element array which is an exposure device of the present invention.

In FIG. 1, reference numeral 1 denotes a substrate, 3 an anode layer, 6 a cathode layer, and 7 an organic compound layer consisting of a hole transport layer 4 and an electron transport layer 5.

Figure 2:
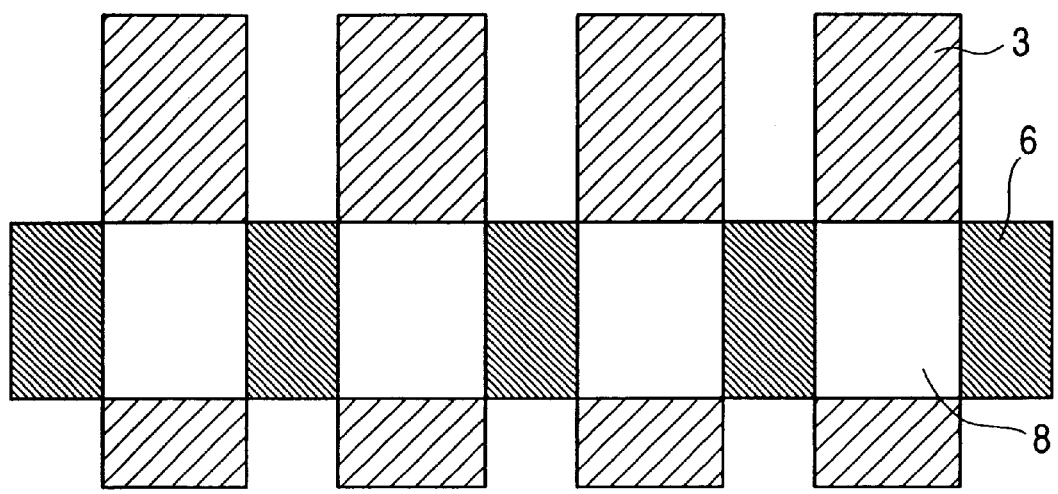
FIG. 2 is an enlarged view of a light emitting portion when seen from the substrate side of the exposure device of FIG. 1.

FIG. 2 is an enlarged view of a light emitting portion when seen from the substrate 1 side. An overlapped portion between the anode layer 3 and the cathode layer 6 serves as a light emitting portion 8. Light is emitted from the light emitting portion by applying voltage between the anode layer 3 and the cathode layer 6 and a light emitting portion having a desired size can be obtained by changing the electrode width of the anode layer 3 or of the cathode layer 6.

Any substrate may be used as the substrate 1 if light emitting elements can be formed on the surface of the substrate. A transparent insulating substrate made of glass such as soda-lime glass or a resin film is preferred.

The material of the anode layer 3 preferably has a large work function, as exemplified by ITO, tin oxide, gold, platinum, palladium, selenium, iridium and copper iodide.

On the other hand, the material of the cathode layer 6 preferably has a small work function, as exemplified by Mg/Ag, Mg, Al, In and alloys thereof.

The organic compound layer 7 may be a single layer or consist of a plurality of layers. For example, as shown in FIG. 1, it consists of a hole transport layer 4 into which holes are injected from the anode layer 3 and an electron transport layer 5 into which electrons are injected from the cathode layer 6. In this case, either one of the hole transport layer 4 and the electron transport layer 5 functions as a light emitting layer. A fluorescent layer containing a phosphor may be formed between the hole transport layer 4 and the electron transport layer 5. The organic compound layer 7 may be a single mixed layer serving as the hole transport layer 4, electron transport layer 5 and fluorescent layer.

The hole transport layer 4 may be formed of N,N'-bis(3-methylphenyl)-N,N'-diphenyl-(1,1'-biphenyl)-4,4'-diamine (to be abbreviated as TPD), for instance. In addition, the following organic materials may be used.

HOLE TRANSPORTING COMPOUNDS hole transporter

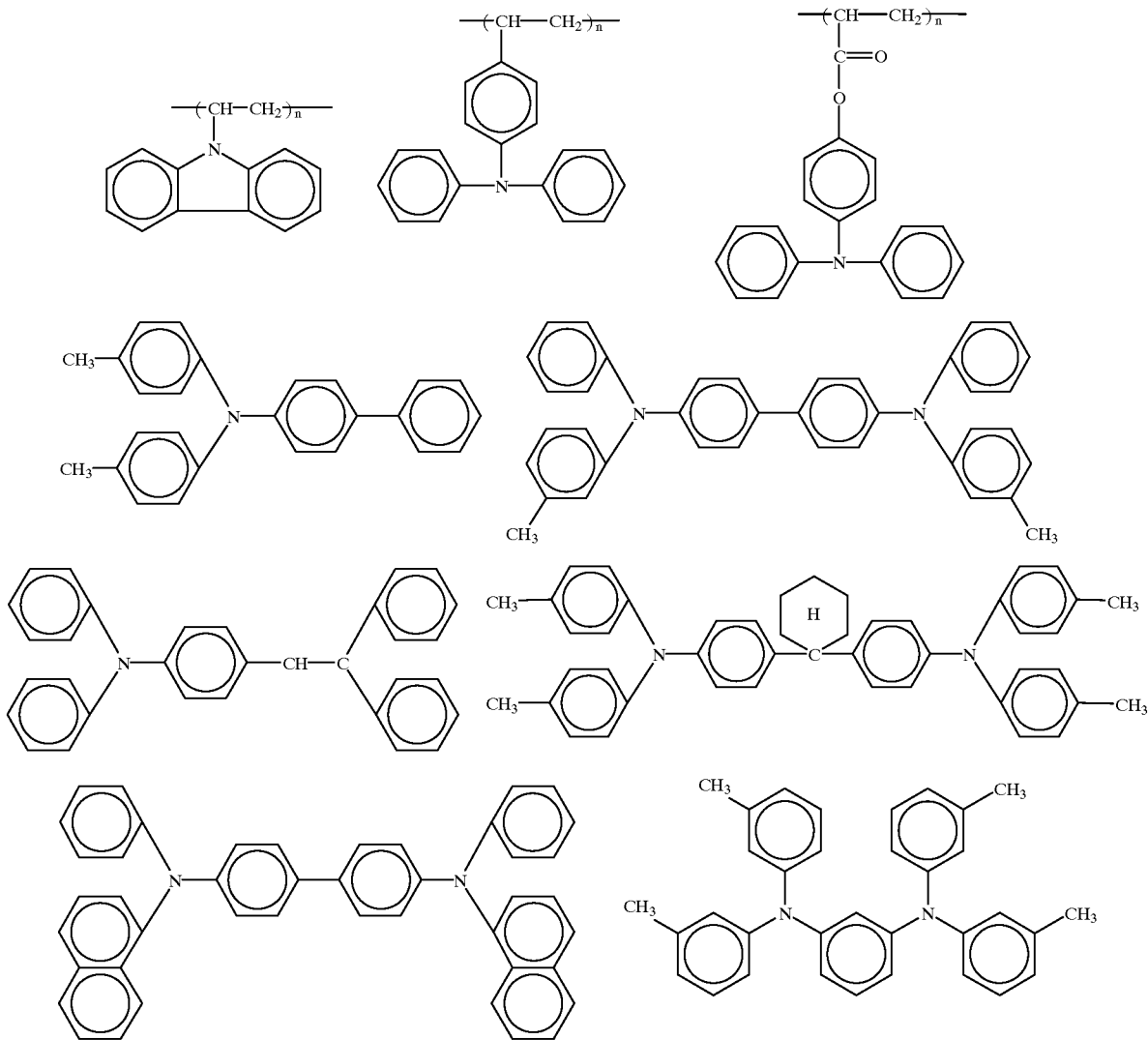

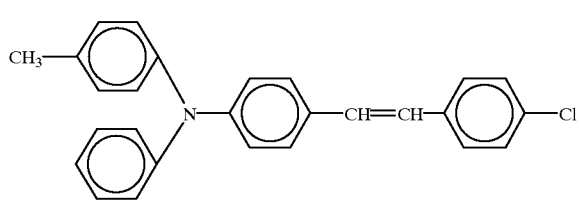
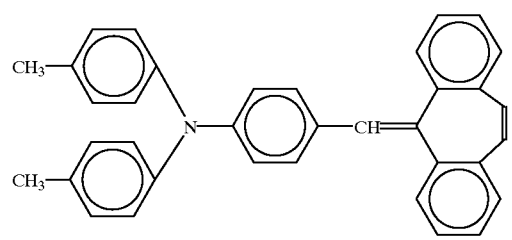
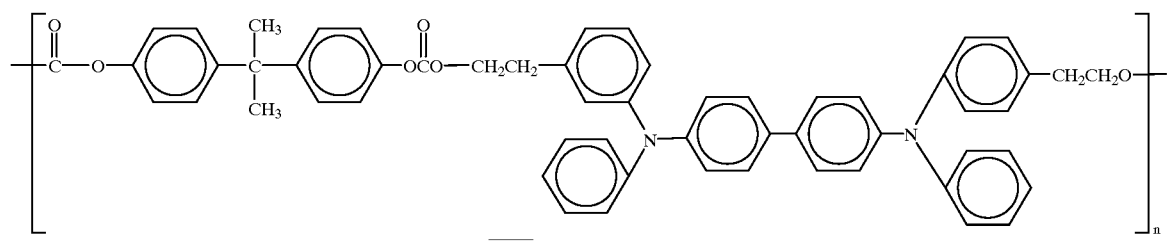
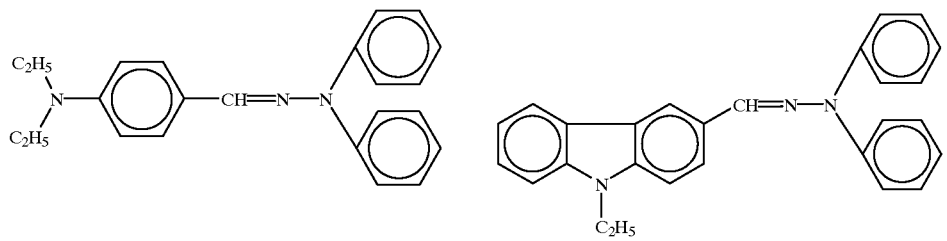
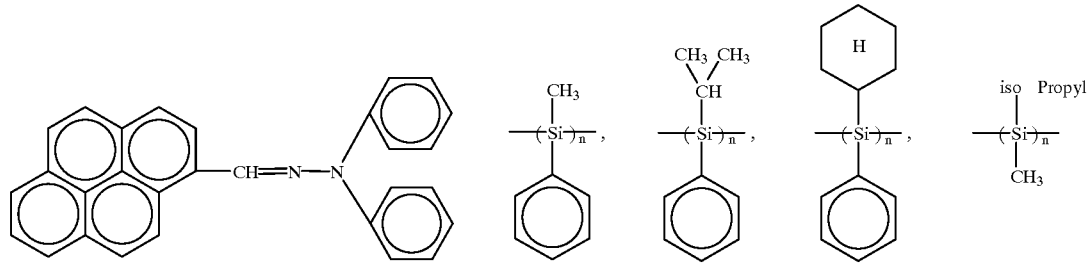

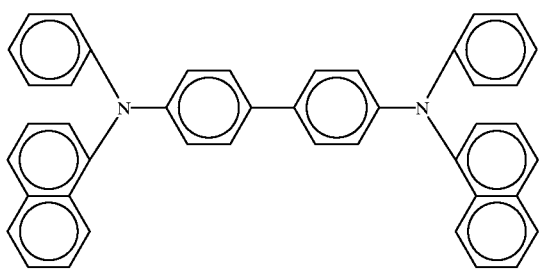
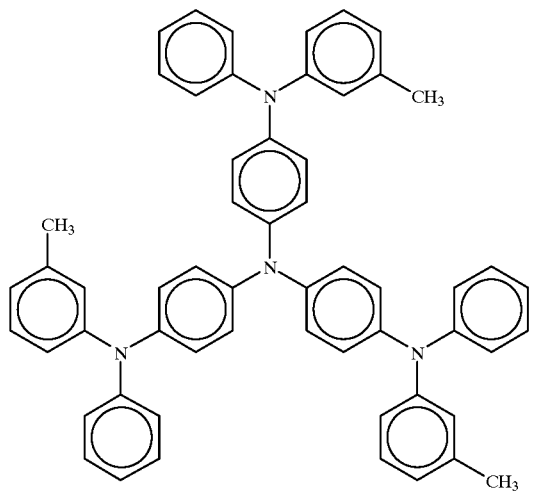
Inorganic materials such as a-Si and a-SiC may also be used.
Tris(8-quinolinol) aluminum (to be abbreviated as Alq3), for example, may be used as the electron transport layer 5 and also the following materials may be used.
ELECTRON TRANSPORTING COMPOUNDS
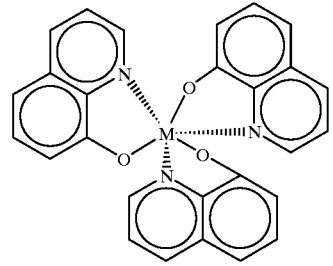
M:Al, Ga
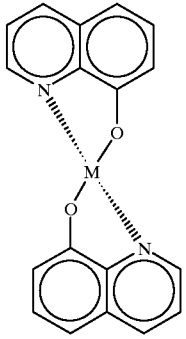
M:Zn, Mg, Be
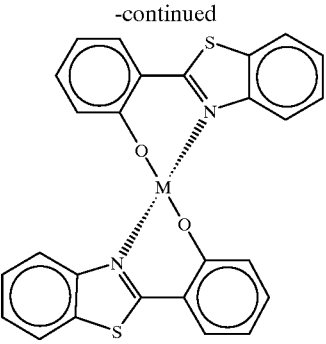
M:Zn, Mg, Be
-continued
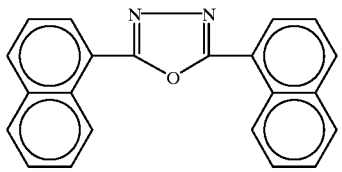
M:Zn, Mg, Be
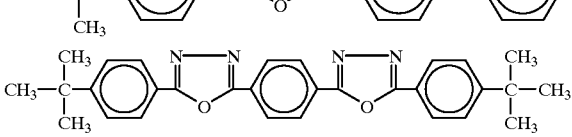
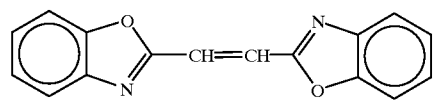
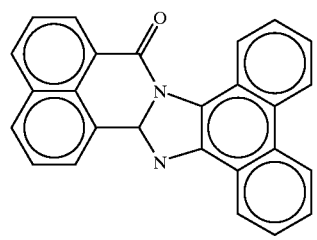
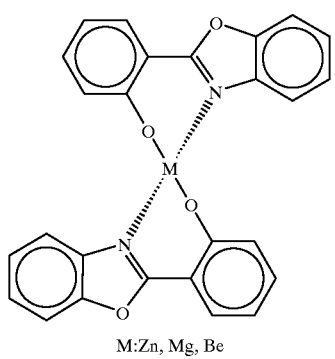
M:Zn, Mg, Be -continued
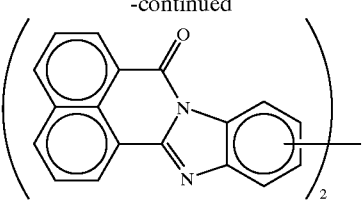
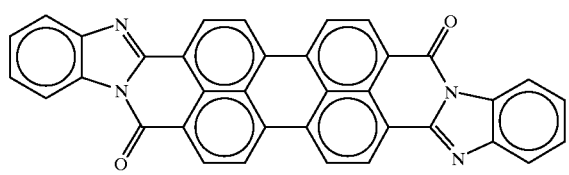
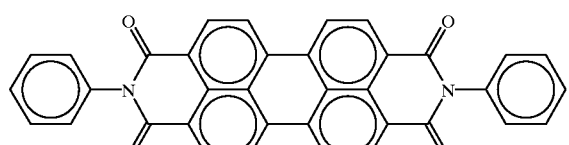
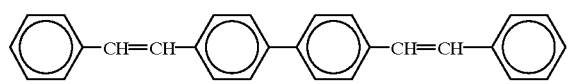
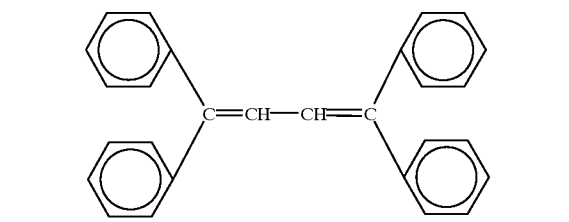
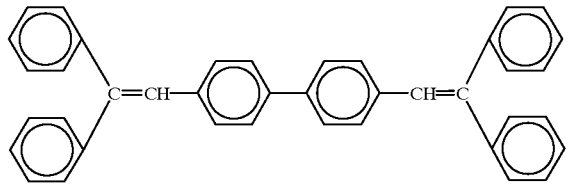
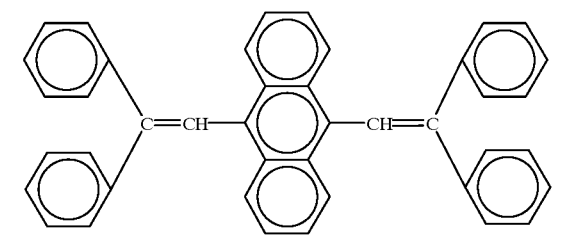
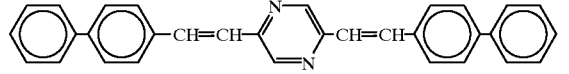
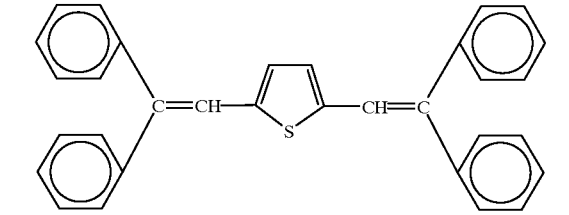
Dopant pigments shown below may be doped on the electron transport layer 5 or the hole transport layer 4.
DOPANT PIGMENTS
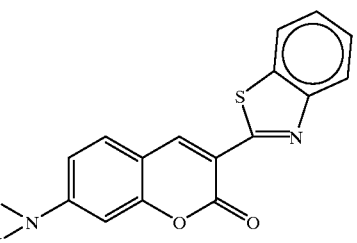
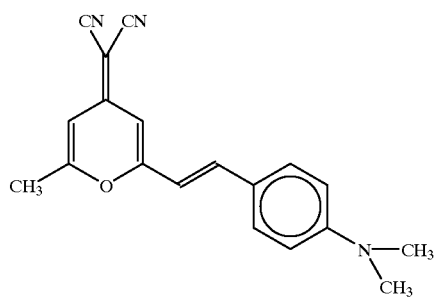
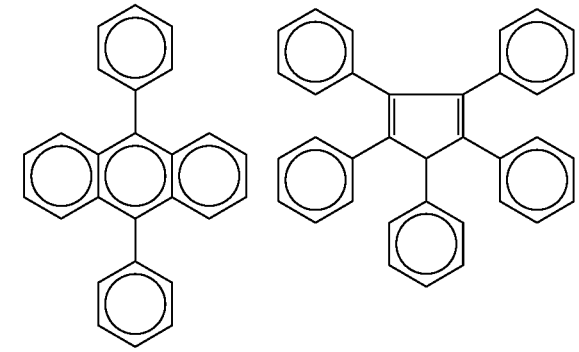
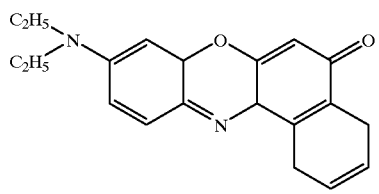
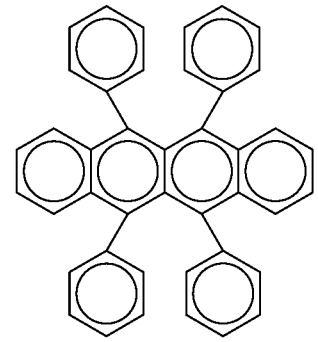

-continued

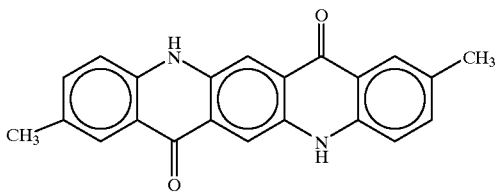

A dielectric layer is preferably formed between the anode layer 3 and the substrate 1. The dielectric layer can increase (or reduce) the reflectance or transmittance of light having a specific wavelength by laminating layers having a different refractive index such as $SiO_2$ and SiO layers. Alternatively, a half mirror may be used to increase (or reduce) the reflectance or transmittance.

A material that emits light having the same spectral sensitivity as that of a photosensitive member used, such as a photosensitive drum, is preferably selected as the material of each layer.

A specific production example is given below.

In this example, a glass substrate is used as the transparent insulating substrate 1. Both sides of the glass substrate are washed thoroughly.

Thereafter, the substrate 1 is covered with a metal mask having a line width of 50 μm and a pitch of 80 μm and a 100 nm-thick ITO film is formed by a sputtering method as the anode layer 3.

At this time, after the formation of the film on the entire surface of the substrate, it may be etched by photolithography to form a desired pattern.

Thereafter, TPD and $Alq_3$ are deposited to a thickness of 50 nm by a vacuum vapor deposition method as the hole transport layer 4 and the electron transport layer 5, respectively. The degree of vacuum at the time of deposition is $2 \times 10^{-6}$ to $3 \times 10^{-6}$ Torr and the film forming speed is 0.2 to 0.3 nm/s.

Finally, the resulting laminate is covered with a metal mask having a line width of 80 μm in such a manner that the metal mask becomes perpendicular to the anode layer 3 and Mg and Ag are co-deposited at a deposition speed ratio of 10:1 to form a 200 nm-thick layer of an alloy of Mg and Ag (10/1) as the cathode layer 6. The film forming speed is 1 nm/s.

When the thus obtained light emitting array is connected to a driver and DC voltage is applied to this array using the ITO electrode which is an anode layer as a positive pole and the Mg/Ag electrode which is a cathode layer as a negative pole, green light emission is obtained from portions where the ITO electrode and the Mg/Ag electrode cross each other and an image can be formed on the surface of the photosensitive member through a SELFOC lens array.

Although a 300 dpi light emitting array is formed in this example, light emitting points having a desired size can be obtained by changing the electrode widths.

Figure 5:
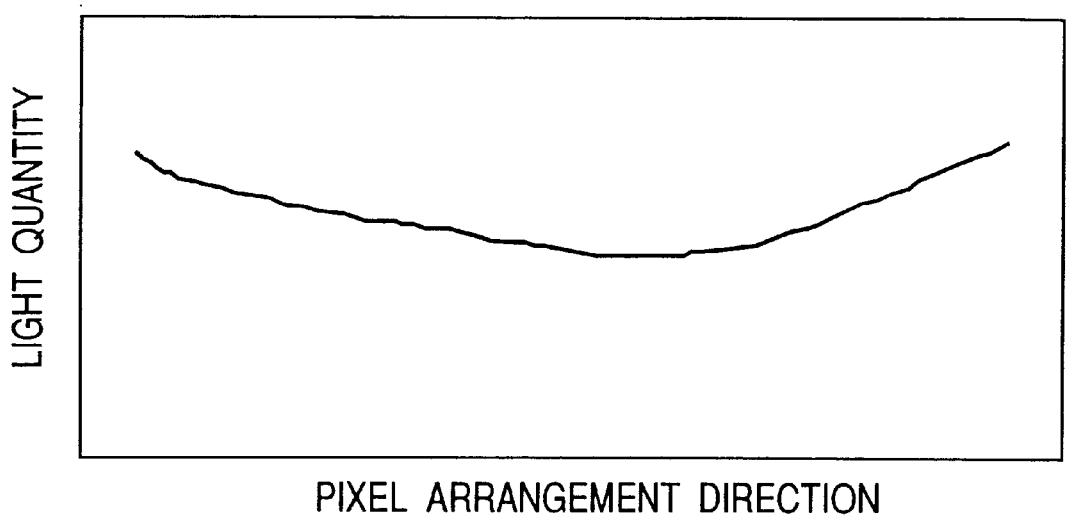
FIG. 5 is a graph showing an example of the emitted light quantity distribution of the exposure device before the adjustment of a light emitting area.

FIG. 5 is a graph showing an example of the emitted light quantity distribution of the light emitting array produced as described above. As shown in FIG. 5, the quantity of emitted light is small at a central portion and large at both end portions in this example. This is probably because field strength applied to light emitting portions at both end portions becomes higher than that at the central portion and the quantity of light becomes large as there is such a deposited film thickness distribution that the film thickness is larger at the central portion than that at both end portions when the organic compound layer is formed by deposition. The emitted light quantity distribution can be improved by reforming a deposition device. However, the emitted light quantity distribution may not be made completely uniform because of other factors.

Figure 6:
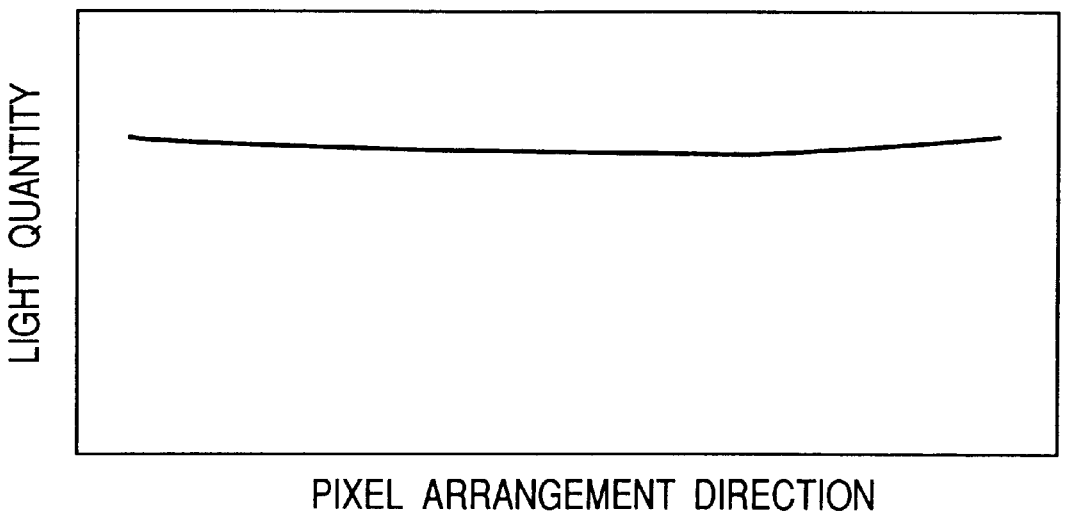
FIG. 6 is a graph showing the emitted light quantity distribution of the exposure device of the present invention.

In the present invention, the quantity of light emitted from each light emitting element is made uniform by controlling the light emitting area of each light emitting element as shown in FIG. 6.

Stated more specifically, each pixel is caused to emit light, the quantity of light emitted from each of all the pixels is measured, and the quantity of light emitted from each light emitting element is made uniform by reducing the light emitting area of a pixel that emits a large quantity of light based on the measurement data.

Figure 7:
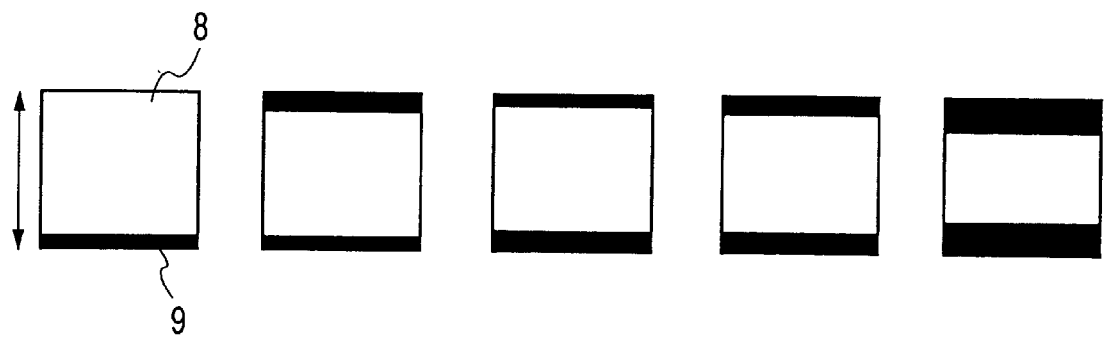
FIG. 7 is a diagram showing examples of the light emitting portion having a reduced light emitting area.

FIG. 7 shows examples of the light emitting portion having a reduced light emitting area.

In FIG. 7, the light emitting surface is directly irradiated with a laser beam or the like which is shrunk to a small size from the substrate side to give heat or light energy to the organic compound layer so as to modify, for example, melt, evaporate or decompose, the organic compound layer, thereby forming a dark portion 9 which does not emit light and reducing the area of the light emitting portion 8. As shown in FIG. 7, a linear dark portion 9 is preferably formed in such a manner that it extends in a direction perpendicular to the rotation direction of the photosensitive member (direction shown by an arrow in FIG. 7) because this prevents light emitting points from being thinner or a change in the shape of the light emitting portion caused by the formation of the dark portion from exerting an influence upon a latent image on the photosensitive member.

Figure 8:
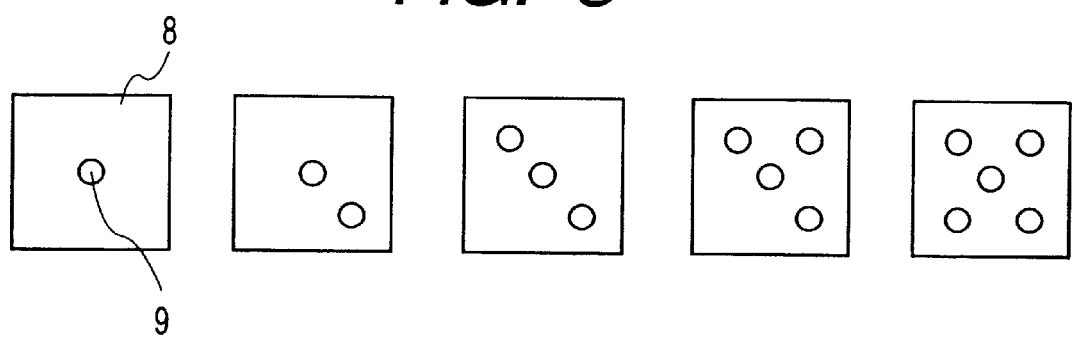
FIG. 8 is a diagram showing other examples of the light emitting portion having a reduced light emitting area.

FIG. 8 shows other examples of the light emitting portion having a reduced light emitting area.

In these examples, the dark portion 9 is formed as a spot in the same manner as in FIG. 7 to minimize a change in the shape of the light emitting point. According to these examples, an image is formed on the photosensitive member by a SELFOC lens array without being influenced by the dark portion 9 due to the MTF characteristics of SLA.

Figure 9:
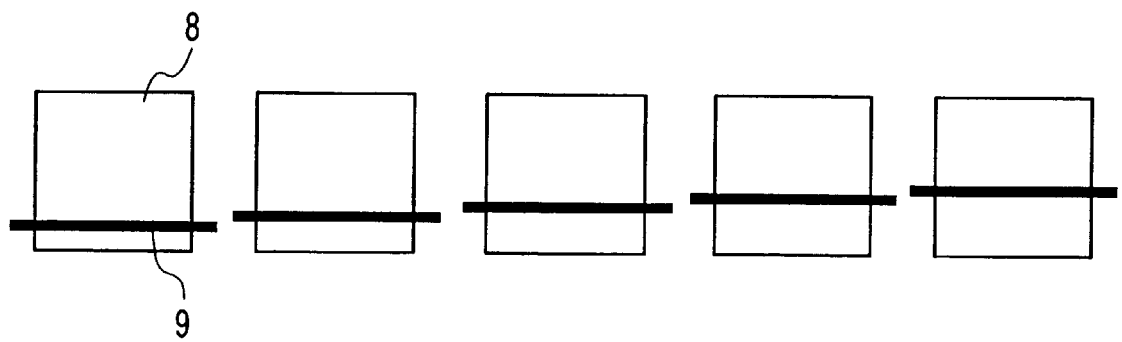
FIG. 9 is a diagram showing still other examples of the light emitting portion having a reduced light emitting area.

FIG. 9 shows still other examples of the light emitting portion having a reduced light emitting area.

In these examples, the light emitting surface is directly irradiated with a laser beam or the like which is shrunk to a small size to give heat or light energy to at least one of the anode layer and the cathode layer so as to modify, for example, melt, evaporate or decompose, or cut the anode layer or the cathode layer, thereby forming the dark portion 9. Particularly, the light emitting portion can be trimmed completely by cutting the anode layer or the cathode layer, thereby making it possible to reduce the light emitting area with more certainty.

Figure 3:
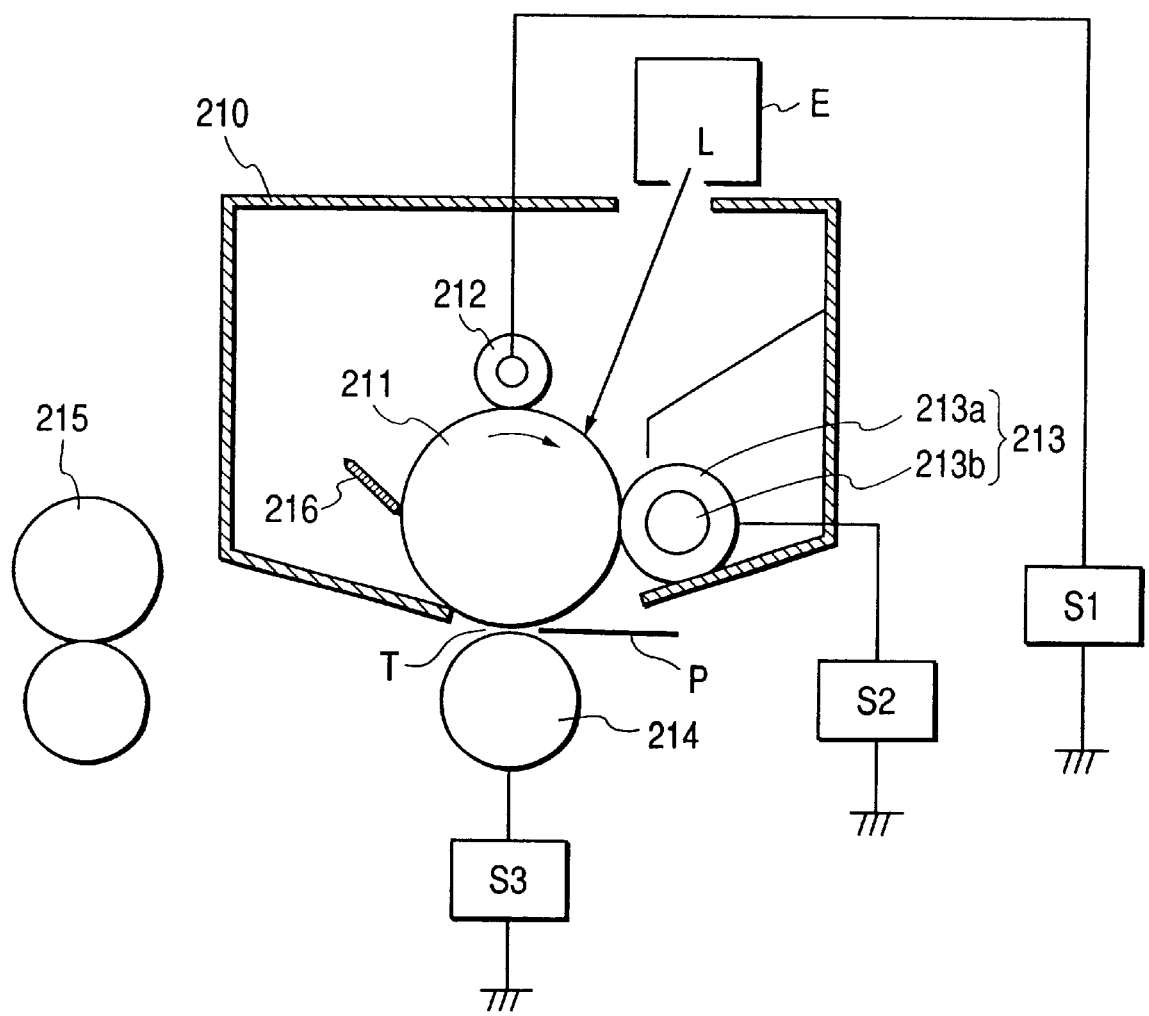
FIG. 3 is a schematic structural diagram showing an example of an image forming apparatus of the present invention.

FIG. 3 is a schematic structural diagram of an image forming apparatus using electrophotography as an example of the image forming apparatus of the present invention.

Reference numeral 211 denotes a rotary drum type electrophotographic photosensitive member as an image carrier, 212 electrifying means, 213 developing means, 214 transfer means, 215 fixing means, 216 cleaning means and E the exposure means of the present invention.

The exposure device E of the present invention is used as the light source of exposure light L. The exposure device is connected to a driver. When DC voltage is applied using the anode layer as a positive pole and the cathode layer as a negative pole, green light emission can be obtained from the light emitting portions and an image can be formed on the photosensitive member 211. Thus, a good image can be obtained.

The photosensitive member 211 is uniformly electrified by the electrifying means 212. The electrified side of the photosensitive member 211 is exposed to light L by the exposure device E in accordance with time series electric digital pixel signals which are objective outputted image information to form an electrostatic latent image corresponding to the objective image information on the peripheral surface of the photosensitive member 211. This electrostatic latent image is developed as a toner image by the developing means 213 which uses an insulating toner. Meanwhile, a transfer material P is supplied from a paper feeding unit (not shown) as a recording material and introduced at a predetermined timing into a press-contact nip portion (transfer portion) T between the photosensitive member 211 and contact transfer means which is contacted to the photosensitive member with predetermined pressure to transfer the toner image by applying predetermined transfer bias voltage.

The transfer material P to which the toner image has been transferred is separated from the surface of the photosensitive member 211, introduced into the fixing means 215 of a heat fixing system or the like to fix the toner image and discharged to the outside of the device as an image formed product (print). The surface of the photosensitive member after the transfer of the toner image to the transfer material P is cleaned by the cleaning means 216 to remove adhered contaminants such as the residual toner and used repeatedly to form an image thereon.

Figure 4:
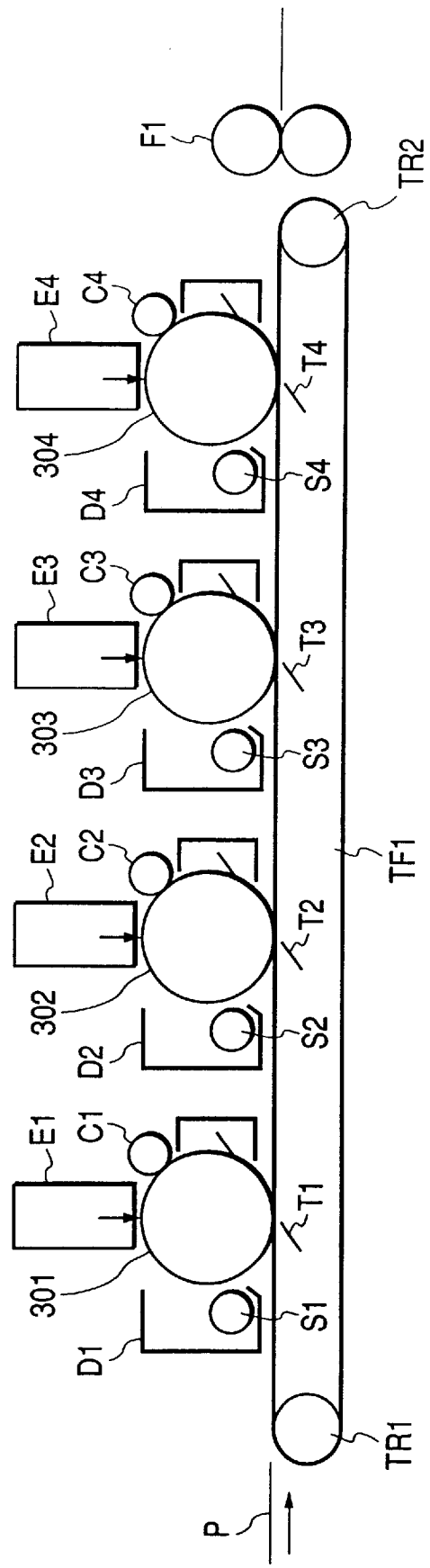
FIG. 4 is a schematic structural diagram showing another example of the image forming apparatus of the present invention.

FIG. 4 is a schematic structural diagram of a multi-color image forming apparatus using electrophotography as another example of the image forming apparatus of the present invention.

C1 to C4 are electrifying means, D1 to D4 developing means, E1 to E4 the exposure means of the present invention, S1 to S4 developing sleeves, T1 to T4 transfer blades, TR1 and TR2 rollers, TF1 transfer belt, P transfer paper, F1 fixing unit, and 301 to 304 rotary drum type electrophotographic photosensitive member.

The transfer paper P is carried in a direction shown by an arrow, guided onto the transfer belt TF1 laid on the rollers TR1 and TR2, and moved to a black transfer position set such that the paper is supported between the photosensitive member 301 and the transfer blade T1 by the transfer belt TF1. At this point, the photosensitive member 301 has a desired black toner image by an electrophotographic process with the electrifying means C1, the exposure means E1 and the developing sleeve S1 of the developing means D1 arranged on the periphery of a drum and the black toner image is transferred to the transfer paper P.

The transfer paper P is moved by the transfer belt TTF1 to a cyan transfer position set such that the paper is supported between the photosensitive member 302 and the transfer blade T2, a magenta transfer position set such that the paper is supported between the photosensitive member 303 and the transfer blade T3, and a yellow transfer position set such that it is supported between the photosensitive member 304 and the transfer blade T4 so that a cyan toner image, magenta toner image and yellow toner image are transferred at the respective transfer positions by the same means as that of the black transfer position.

Since the photosensitive members 301 to 304 rotate properly at this point, the registration of each image can be carried out properly. The transfer paper P on which multi-color recording is carried out by the above process is supplied to the fixing unit F1 to fix the images, thereby making it possible to obtain a desired multi-color image.

As described above, according to the present invention, since the quantity of light emitted from each light emitting element is made uniform by controlling the light emitting area of each light emitting portion of the light emitting element, a special peripheral drive circuit and the like are not required to correct the quantity of light and nonuniformity in the quantity of light emitted from each light emitting element can be eliminated.

Further, according to the present invention, since the simple and high-accuracy correction of the quantity of light is made possible, the present invention is more effective when the number of light emitting pixels is increased to achieve high density.

What is claimed is:

1. A light emitting element array having a plurality of surface emission type light emitting elements each comprising:

an anode layer;

a cathode layer; and a light emitting layer including an organic compound sandwiched between the anode layer and the cathode layer, wherein each of said plurality of light emitting elements has a light emitting portion whose area is adjusted according to a quantity of light emitted therefrom by modifying the organic compound, thereby making uniform the emitted light quantity distribution of the entire array of light emitting elements.

2. A light emitting element array according to claim 1, wherein differences in the quantity of emitted light among said plurality of light emitting elements are reduced by selectively reducing the area of the light emitting portion of the light emitting element that emits a relatively large quantity of light out of said plurality of light emitting elements so as to make uniform the emitted light quantity distribution of the entire array of the light emitting elements.

3. A light emitting element array according to claim 2, wherein the area of the light emitting portion of the light emitting element is reduced by modifying said light emitting layers of the light emitting portion through the irradiation of energy beam onto part of the light emitting portion to prevent emission.

4. A light emitting element array according to claim 2, wherein the area of the light emitting portion of the light emitting element is reduced by modifying part of said anode layer of the light emitting portion through the irradiation of an energy beam onto part of the light emitting portion to prevent the portion from forming an electrode.

5. A light emitting element array according to claim 2, wherein the area of the light emitting portion of the light emitting element is reduced by modifying part of said cathod layer of the light emitting portion through the irradiation of an energy beam onto part of the light emitting portion to an energy beam to prevent the portion from forming an electrode.

6. A light emitting element array according to claim 2, wherein the area of the light emitting portion of the light emitting element is reduced by forming a spot dark portion that does not emit light in the light emitting portion through the irradiation of an energy beam onto part of the light emitting portion.

7. An exposure device comprising the light emitting element array according to any one of claims 1 to 6.

8. An image forming apparatus comprising the light emitting element array according to any one of claims 1 to 6, for exposing a photosensitive member to form a latent image on the photosensitive member.

9. An image forming apparatus according to claim 8, wherein the formation of the dark portion through the irradiation of an energy beam is carried out by moving the energy beam irradiation position on the light emitting element in a direction perpendicular to the relative moving direction of the light emitting element with respect to the photosensitive member at the time of the exposure of the photosensitive member.

10. A light emitting element array according to claim 1, wherein the modification of the organic compound is performed by directly irradiating a light emitting surface of the light emitting element with an energy beam.

* * * * *

UNITED STATES PATENT AND TRADEMARK OFFICE
CERTIFICATE OF CORRECTION

PATENT NO. : 6,344,661 B1
DATED : February 5, 2002
INVENTOR(S) : Nagase et al.

It is certified that error appears in the above-identified patent and that said Letters Patent is hereby corrected as shown below:

<u>Column 14,</u>
Line 56, "cathod" should read -- cathode --.

Signed and Sealed this

Eighteenth Day of June, 2002

Attest:

Attesting Officer

JAMES E. ROGAN
Director of the United States Patent and Trademark Office